United States Patent
Ito

(10) Patent No.: US 7,125,584 B2
(45) Date of Patent: *Oct. 24, 2006

(54) METHOD FOR FORMING A LIQUID FILM ON A SUBSTRATE

(75) Inventor: Shinichi Ito, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/697,436

(22) Filed: Oct. 31, 2003

(65) Prior Publication Data

US 2004/0091607 A1     May 13, 2004

Related U.S. Application Data

(62) Division of application No. 10/144,028, filed on May 14, 2002, now Pat. No. 6,669,982, which is a division of application No. 09/669,725, filed on Sep. 26, 2000, now Pat. No. 6,410,080.

(30) Foreign Application Priority Data

Sep. 27, 1999    (JP)    ............................. 11-272327

(51) Int. Cl.
    *B05D 1/02* (2006.01)
(52) U.S. Cl. ................... 427/424; 427/256; 427/427.2; 427/427.3; 427/421.1
(58) Field of Classification Search .................. 427/8, 427/420, 421.1, 424, 427.2, 427.3, 427.4, 427/427.6
See application file for complete search history.

(56) References Cited

U.S. PATENT DOCUMENTS 5,736,195 A     4/1998   Haaland ..................... 427/180

(Continued)

FOREIGN PATENT DOCUMENTS

JP          2-220428           9/1990

(Continued)

OTHER PUBLICATIONS

Notification of Reasons for Rejection issued by Japanses Patent Office, mailed Feb. 8, 2005, in Japanese Patent Application No. 2000-255461, and English-language translation.

*Primary Examiner*—Katherine Bareford
(74) *Attorney, Agent, or Firm*—Finnegan, Henderson, Farabow, Garrett & Dunner, L.L.P.

(57) ABSTRACT

A liquid film forming method of dropping a liquid adjusted to be spread into a give amount on a substrate to be processed from a dropping nozzle or dropping nozzles of a dropping unit onto the substrate, and then moving the dropping unit and the substrate relatively while keeping the dropped liquid on the substrate, so as to form a liquid film on the substrate, wherein the relative movement of the dropping unit and the substrate is composed of straight movement along a file direction in which the dropping unit passes from one end side of the substrate through an upper space of the substrate to the other end side of the substrate, and movement along a rank direction outside the substrate, movement distance along the file direction is the sum of dropping length (L) over the substrate and distance of an acceleration/deceleration section, and movement speed (v) along the file direction over the substrate is defined dependently on the square root of the product of the dropping length (L) and the absolute value of acceleration/deceleration (a) within the acceleration/deceleration section.

3 Claims, 10 Drawing Sheets

U.S. PATENT DOCUMENTS

| | | | |
|---|---|---|---|
| 5,776,545 A * | 7/1998 | Yoshiba et al. | 427/64 |
| 5,968,268 A | 10/1999 | Kitano et al. | 118/52 |
| 6,059,880 A | 5/2000 | Kitano et al. | 118/52 |
| 6,076,979 A | 6/2000 | Mimasaka et al. | 396/604 |
| 2004/0091606 A1 * | 5/2004 | Ito | 427/96 |

FOREIGN PATENT DOCUMENTS

| | | |
|---|---|---|
| JP | 6-151295 | 5/1994 |
| JP | 7-169684 | 7/1995 |
| JP | 7-321001 | 12/1995 |
| JP | 9-320950 | 12/1997 |
| JP | 10-284397 | 10/1998 |

* cited by examiner

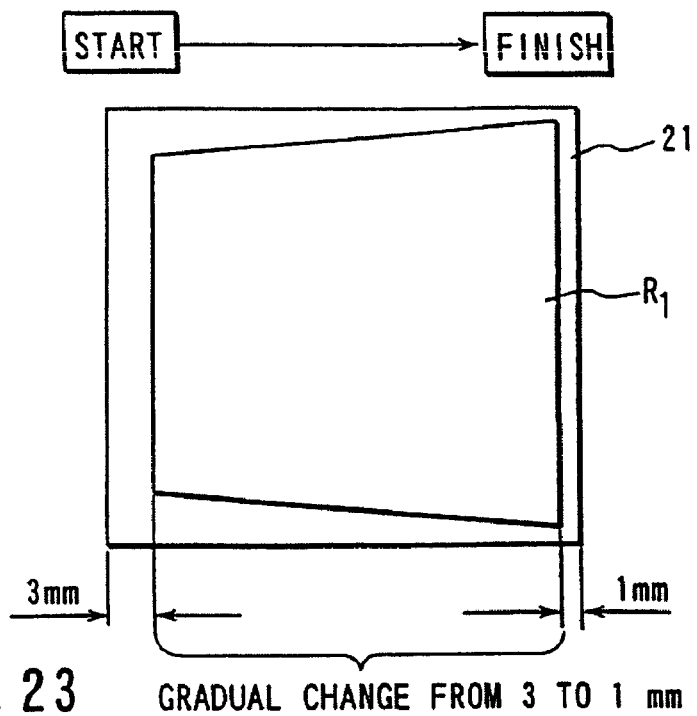
FIG. 23  GRADUAL CHANGE FROM 3 TO 1 mm
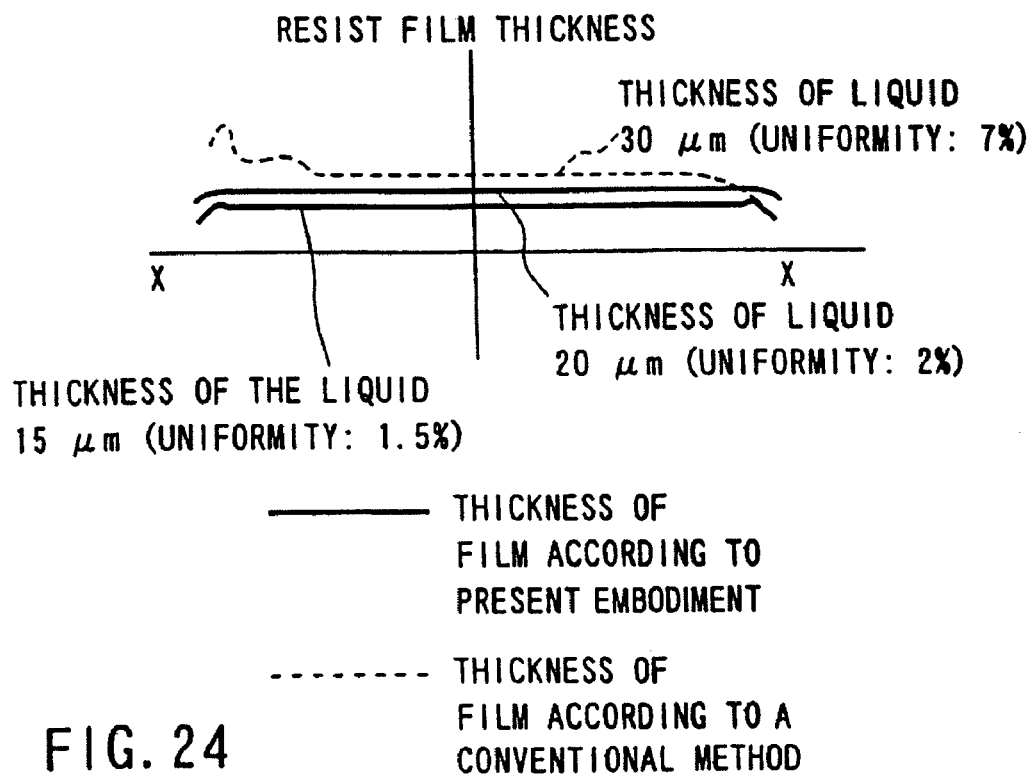
FIG. 24

METHOD FOR FORMING A LIQUID FILM ON A SUBSTRATE

CROSS-REFERENCE TO RELATED APPLICATIONS

This is a divisional of application Ser. No. 10/144,028, filed May 14, 2002, now U.S. Pat. No. 6,669,982, which is a divisional of application Ser. No. 09/669,725, filed on Sept. 26, 2000, now U.S. Pat. No. 6,410,080, and claims the benefit of priority from the prior Japanese Patent Application No. 11-272327, filed Sept. 27, 1999, the entire contents of which are incorporated herein by reference.

BACKGROUND OF THE INVENTION

This invention relates to a liquid film forming method wherein a liquid is applied onto a substrate to be processed so as to form a liquid film.

In spin coating method, which has been used in lithographic steps, almost all of a liquid dropped onto a substrate is discharged outside the substrate so that a film is formed from the remainder thereof, which is several percent of the liquid. Therefore, most of the dropped liquid is of no use. Since most of the liquid is discharged, an adverse effect is produced on environment. Moreover, there arises a problem that in rectangle substrates or disc-shaped substrates having a large diameter of 12 inches or more, turbulent air is generated at the circumferential portion of the substrates so that the film thickness uniformity of this portion becomes deteriorated.

As a method of applying a liquid uniformly onto the whole of a substrate without vain use of the liquid, Jpn. Pat. Appln. KOKAI Publication No. 2-220428 describes a method of dropping a Resist from many nozzles which are arranged along one line and, spraying from the back thereof, a gas or a liquid onto a film-forming surface to obtain a uniform film. Jpn. Pat. Appln. KOKAI Publication No. 6-151295 describes a technique wherein many spray nozzles are made in a rod and a resist is dropped out from them onto a substrate in order to obtain a uniform film. Furthermore, Jpn. Pat. Appln. KOKAI Publication No. 7-321001 describes a method of using a spray head in which many spray nozzles for spraying a resist are made and moving the head relatively to a substrate to perform application.

In all of these applicators, plural dropping or spraying nozzles are arranged along one rank and they are scanned in order to obtain a uniform film. Besides application methods using a device having these nozzles, there is known a method of using a single liquid jetting-out nozzle and the nozzle is scanned over a substrate to be processed, so as to form a liquid film.

These methods have a problem that the processing time per substrate becomes long dependently on a method of handling the nozzle(s) or the use amount of a liquid gets very large.

BRIEF SUMMARY OF THE INVENTION

An object of the present invention is to provide a liquid film forming method making it possible to shorten processing time and suppress the use amount of a liquid.

In order to attain the above-mentioned object, the present invention is as follows.

(a) A first aspect of the liquid film forming method according to the present invention is a liquid film forming method of dropping a liquid adjusted to be spread into a give amount on a substrate to be processed from a dropping nozzle or dropping nozzles of a dropping unit onto the substrate, and then moving the dropping unit and the substrate relatively while keeping the liquid dropping on the substrate, so as to form a liquid film on the substrate, wherein the relative movement of the dropping unit and the substrate is composed of straight movement along a file direction in which the dropping unit passes from one end side of the substrate through an upper space of the substrate to the other end side of the substrate, and movement along a rank direction outside the substrate, movement length along the file direction is the sum of dropping length (L) over the substrate and length of an acceleration/deceleration section, and movement speed (v) along the file direction over the substrate is defined dependently on the square root of the product of the dropping length (L) and the absolute value of acceleration/deceleration (a) within the acceleration/deceleration section.

(b) A second aspect of the liquid film forming method according to the present invention is a liquid film forming method of dropping a liquid adjusted to be spread into a give amount on a disc-shaped substrate which is to be processed and has a diameter (D) has from a dropping nozzle or dropping nozzles of a dropping unit above the substrate, and then moving the dropping unit and the substrate relatively while keeping the liquid dropping on the substrate, so as to form a liquid film on the substrate, wherein the relative movement of the dropping unit and the substrate is composed of straight movement along a file direction in which the dropping unit passes from one end side of the substrate through an upper space of the substrate to the other end side of the substrate, and movement along a rank direction outside the substrate, and movement speed (v) along the file direction is defined dependently on the square root of the product of constant 0.4, the diameter (D) of the substrate, and the absolute value of acceleration/deceleration (a) before and after the time when the movement speed (v) is given.

Preferred embodiments of the above-mentioned inventions are as follows.

Dropping amount (W) from the dropping nozzle or the dropping nozzles of the dropping unit positioned over the substrate is defined dependently on an amount proportional to the movement speed (v).

The dropping unit has plural dropping nozzles and the dropping amount (W) is the total amount of the liquid dropped from all of the dropping nozzles.

The liquid is any one selected from an antireflection material, a resist material, a low dielectric material, an insulating material, a wiring material and a metal paste.

The liquid film is formed, using the liquid having a characteristic that when/a minute amount of the liquid is dropped onto a minute area of the substrate, a change amount of a contact angle of the liquid to the substrate is within ±2 degrees during a time from 5 seconds to 60 seconds after the dropping of the liquid.

(c) A third aspect of the liquid film forming method according to the present invention is a liquid film forming method of dropping a liquid adjusted to be spread into a give amount on a substrate to be processed from a dropping nozzle or dropping nozzles of a dropping unit onto the substrate, and then moving the dropping unit and the substrate relatively while keeping the dropped liquid on the substrate, so as to form a liquid film on the substrate, wherein the relative movement of the dropping unit and the substrate is composed of straight movement along a file direction in which the dropping unit passes from one end side of the substrate through an upper space of the substrate to the other end side of the substrate, and movement along a rank direction outside the substrate, or is composed of spiral movement in which the dropping unit goes from the substantial center of the substrate to the periphery thereof or from the periphery of the substrate to the substantial center thereof, and a change amount of a contact angle of the liquid to the substrate is within ±2 degrees during a time from 5 seconds to 60 seconds after the dropping of the liquid when a minute amount of the liquid is dropped onto a minute area of the substrate.

A preferred embodiment of the above-mentioned invention is as follows.

Control of the change amount of the contact angle of the liquid dropped onto the substrate to the substrate within ±2 degrees is attained by adjusting the ratio of a surfactant to a solvent and an application agent constituting the liquid.

(d) The liquid for application according to the present invention is a liquid for application used in a liquid film forming method of dropping the liquid adjusted to be spread into a give amount on a substrate to be processed from a dropping nozzle or dropping nozzles of a dropping unit onto the substrate, and then moving the dropping unit and the substrate relatively while keeping the dropped liquid on the substrate, so as to form a liquid film on the substrate, comprising a solvent, an application agent, and a surfactant, wherein the ratio of the surfactant to the solvent and the application agent is adjusted in such a manner that when a minute amount of the liquid is dropped onto a minute area of the substrate, a change amount of a contact angle of the liquid to the substrate is within ±2 degrees during a time from 5 seconds to 60 seconds after the dropping of the liquid.

(e) A fourth aspect of the liquid film forming method according to the present invention is a liquid film forming method of dropping a liquid adjusted to be spread into a give amount on a substrate to be processed from a dropping nozzle or dropping nozzles of a dropping unit onto the substrate, and then moving the dropping unit and the substrate relatively while keeping the liquid dropping on the substrate, so as to form a liquid film on the substrate, wherein the relative movement of the dropping unit and the substrate is composed of straight movement along a file direction in which the dropping unit passes from one end side of the substrate through an upper space of the substrate to the other end side of the substrate, and movement along a rank direction outside the substrate, or is composed of spiral movement in which the dropping unit goes from the substantial center of the substrate to the periphery thereof or from the periphery of the substrate to the substantial center thereof, and a dropping area is defined in such a manner that when the liquid film is spread by its fluidity, the liquid does not extend over a boundary step of the substrate film in the edge area of the substrate.

(f) A fifth aspect of the liquid film forming method according to the present invention is a liquid film forming method of dropping a liquid adjusted to be spread into a give amount on a substrate to be, processed from a dropping nozzle or dropping nozzles of a dropping unit onto the substrate, and then moving the dropping unit and the substrate relatively while keeping the liquid dropping on the substrate, so as to form a liquid film on the substrate, wherein the relative movement of the dropping unit and the substrate is composed of straight movement along a file direction in which the dropping unit passes from one end side of the substrate through an upper space of the substrate to the other end side of the substrate, and movement along a rank direction outside the substrate, or is composed of spiral movement in which the dropping unit goes from the substantial center of the substrate to the periphery thereof or from the periphery of the substrate to the substantial center thereof, and relationship between the distance from a dropping start position along the rank direction to a boundary step of the edge of the substrate and that from a dropping finish position along the rank direction to the boundary step of the edge thereof is set so that the former distance is large and the latter distance is small, and the distance between an end of the liquid film and the boundary step of the edge along the file direction is set so as to gradually become smaller from the dropping start position to the dropping finish position.

The present invention has the above-mentioned features so as to have the following effects and advantages.

By deciding the movement speed along the file direction under the above-mentioned conditions, it is possible to shorten the time for forming the liquid film on the substrate and suppress the use amount of the liquid.

Moreover, by deciding the dropping amount (W) from the dropping unit dependently on an amount proportional to the movement speed (v) or making the dropping amount constant, it is possible to make the thickness of the liquid film formed on the substrate uniform.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 23 is a view for explaining an example in which the liquid film forming method according to the fourth embodiment is applied to a rectangle substrate;

FIG. 24 is a view showing the profile of the resist thickness formed by a liquid film forming method according to a fifth embodiment;

DETAILED DESCRIPTION OF THE INVENTION

Referring to the attached drawings, embodiments of the present invention will be described.

[First Embodiment]

Figure 1:
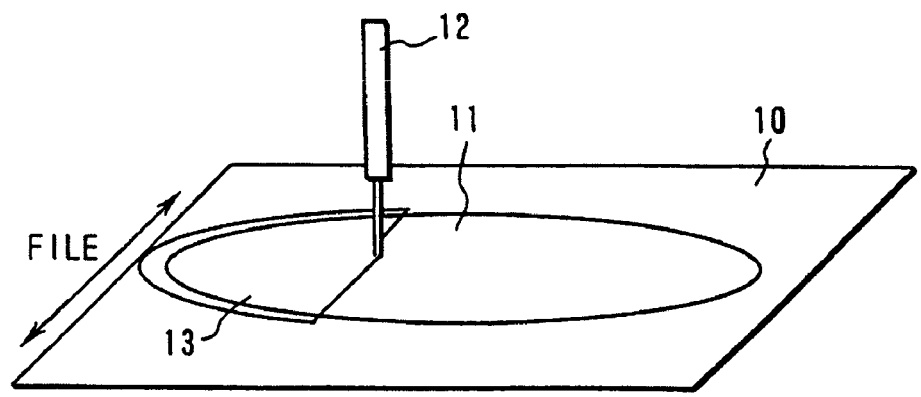
FIG. 1 is a view for explaining a liquid film forming method, using a single liquid supply nozzle, according to a first embodiment.

In the present invention, a liquid supply nozzle (a dropping unit or a dropping nozzle) and a substrate to be processed are relatively moved to supply a liquid on the substrate. As shown in, for example, FIG. 1, a liquid supply nozzle (a dropping unit or a dropping nozzle) 12 is being moved above a substrate 11 to be processed, which is put on an assistant plate 10, so that a liquid film is being formed.

Figure 2:
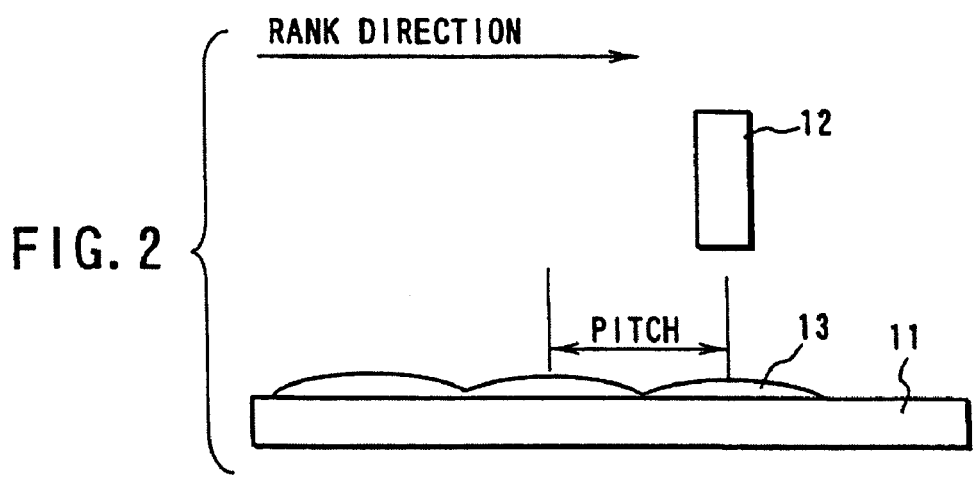
FIG. 2 is a view for explaining a movement pitch of the liquid supply nozzle along the rank direction.

FIG. 2 shows details that the liquid film 13 is formed. In FIG. 2, the liquid film 13 is successively formed from the left side of the paper. The liquid supply nozzle 12 is reciprocated back and forth of the paper (along the file direction), and the nozzle 12 is moved right (along the rank direction) by a movement pitch p at an end of the reciprocating motion.

Figure 3:
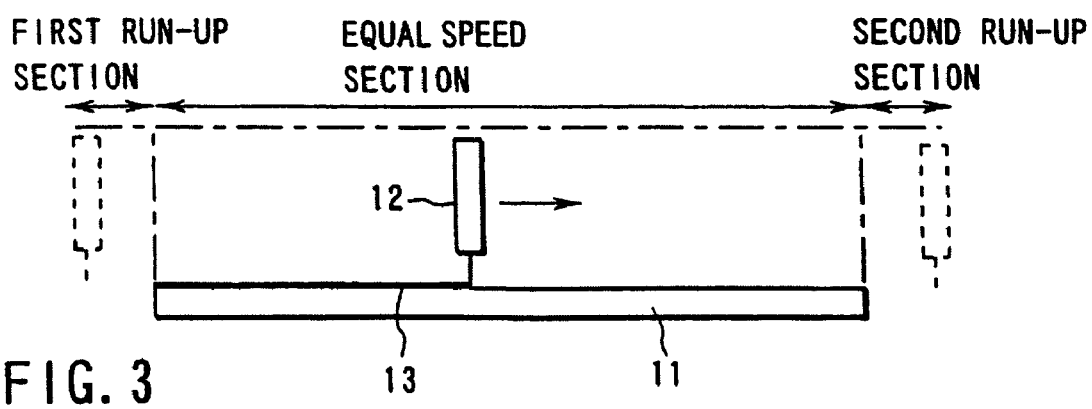
FIG. 3 is a view for explaining an acceleration section, a deceleration section and an equal speed section of the liquid supply nozzle along the file direction.

The movement speed along the file direction changes as shown in FIG. 3. That is, the nozzle 12 is accelerated at an acceleration (a) up to a speed (v) [=a×t wherein t is an acceleration time] inside an acceleration section. Thereafter, the nozzle 12 is moved at an equal speed of the speed (v) over the substrate 11. Furthermore, the nozzle 12 is decelerated at an acceleration (−a) to a speed of zero inside a deceleration section. Using the length (L) that the nozzle 12 passes over the substrate 11, the movement speed thereof (v), the acceleration (a) inside the acceleration section (a first run-up section in an advance path, and a second run-up section in a return path), the acceleration (−a) inside the deceleration section (the second run-up section in the advance path, and the first run-up section in the return path), processing time (t) necessary for one file is represented as follows:

$$t = \frac{L}{v} + 2\frac{v}{a} \quad (1)$$

Figure 4:
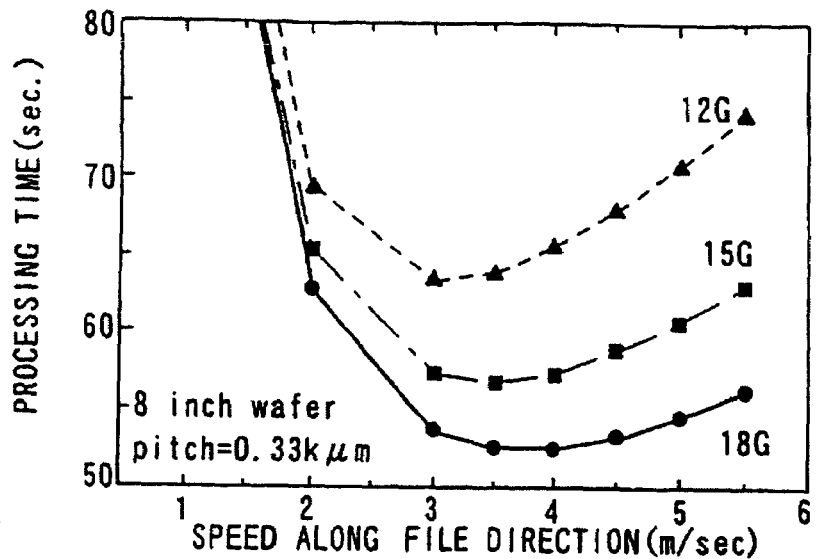
FIG. 4 is a graph of processing time to movement speed along the file direction of the liquid supply nozzle (8 inch. Wafer)

FIG. 4 shows processing time for a single wafer, which is a disc-shaped 8-inch (20 cm) wafer, when the wafer is moved at the movement speed (v) having an acceleration of 12G, 15G or 18G (G=9.8 m/sec$^2$). A movement pitch (p) is set to 0.33 mm. The movement pitch (p) is not limited to 0.33 mm so far as the movement pitch makes it possible that when the liquid jetted out onto a plane surface is sufficiently spread and the resultant liquid film is dried so that solid contents thereof form a film, the film becomes substantially flat. FIG. 4 does not demonstrate that as the movement (scan) speed along the file direction becomes higher, the processing time becomes shorter, but demonstrates that the movement speed along the file direction for shortening the processing time has an optimal value (minimum value). This is because acceleration/deceleration length (time) becomes longer as the movement speed becomes higher.

Figure 5:
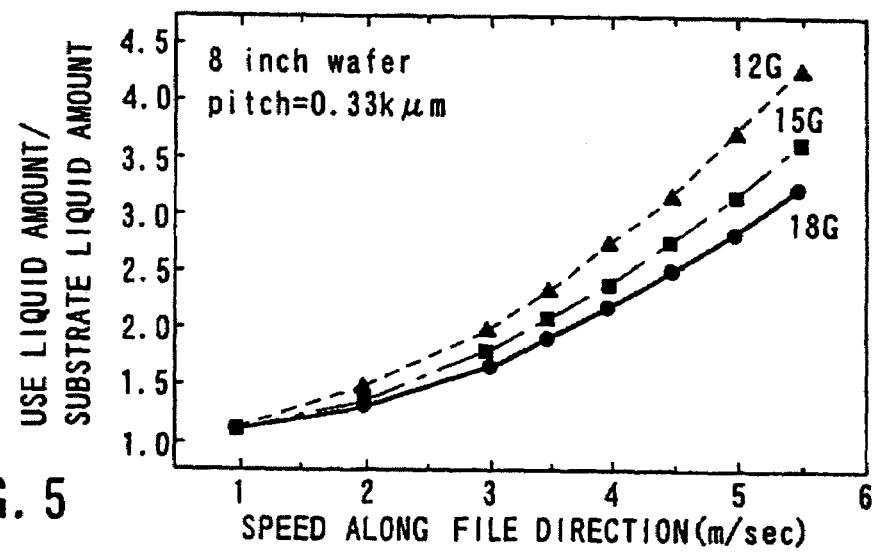
FIG. 5 is a graph of consumption amount of a liquid to movement speed along the file direction of the liquid supply nozzle (12 inch. Wafer)

The optimal value of the movement speed for shortening the processing time varies dependently on acceleration (deceleration). As acceleration (deceleration) is larger, the optimal value of the movement speed becomes larger. The processing time does not change very much even if the movement speed is made more than the optimal value. However, if the movement speed is made large, the use amount of the liquid increases highly as shown in FIG. 5 since the liquid is supplied even within the acceleration (deceleration) section. The vertical axis of FIG. 5 represents the value of (use liquid amount/substrate liquid amount), and means that as this value is larger, the vainness of the liquid is larger. In the case that the value of (use liquid amount/substrate liquid amount) is 2, the amount of the liquid discharged out of the substrate equal to the amount of the liquid for forming on the substrate.

According to the appropriate movement speed shown in FIG. 4, the value of (use liquid amount/substrate liquid amount) is about 2. However, vainness of more than the use liquid amount is caused if the movement speed is made higher. Therefore, it is preferred to scan the nozzle at a speed near the appropriate movement speed.

Incidentally, the movement speed along the file direction which makes the processing time (t) minimum (the appropriate movement speed) can be obtained by calculating a value of (v) that makes dt/dv to zero from the equation (1), and the movement speed (v) is represented by the following:

$$v = \sqrt{\frac{La}{2}} \quad (2)$$

The thickness (d) of the liquid film formed on the substrate becomes a value proportional to the value obtained by dividing the dropping amount (W) [ml/sec] per unit time by the speed (v) [m/sec] (d∝W/v). Therefore, in order to form a liquid film having a uniform thickness on the substrate, it is necessary to define the dropping amount (W) as an amount proportional to the speed (v). However, in areas where no liquid film needs to be formed, for example, an edge of the substrate, the dropping amount of the liquid may be reduced or the dropping of the liquid may be stopped.

In the present embodiment, the liquid is dropped from the single nozzle. However, in the case that a liquid is dropped from plural nozzles, the total amount of the liquid dropped from all of the nozzles corresponds to the dropping amount.

In the case of processing a rectangle substrate, the speed (v) is desirably decided from the equation (2) since the application length (L) of the rectangle substrate is constant. However, In the case of a disc-shaped substrate, the speed (v) obtained from the equation (2) does not necessarily become an appropriate movement speed since the application length (L) changes from 0 to its diameter.

Figure 6:
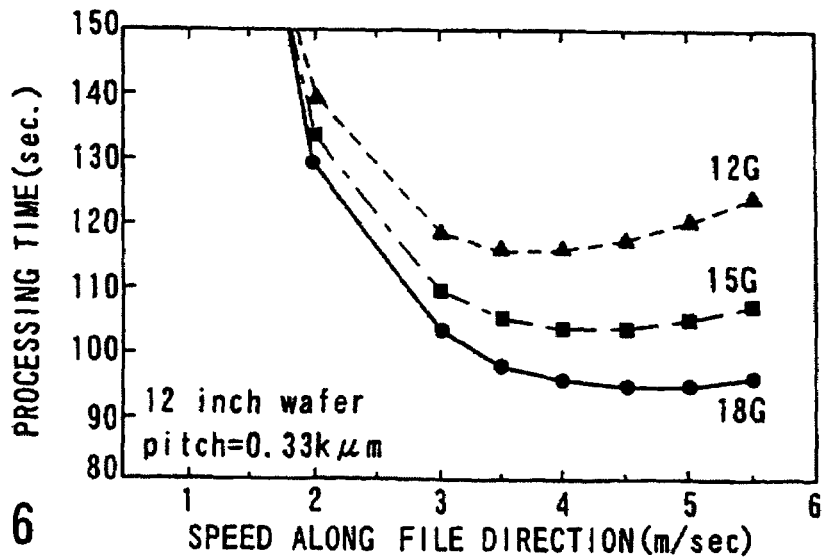
FIG. 6 is a graph of processing time to movement speed along the file direction of the liquid supply nozzle.

Table 1 shows the relationship of FIG. 4, that of FIG. 6, and appropriate movement speeds at the portion corresponding to the diameter, which are obtained from the equation (2).

TABLE 1

| ACCELERATION (1 G = 9.8 m/sec²) | APPROPRIATE MOVEMENT SPEED IN DIAMETER; V₀(m/sec) | ACTUAL APPROPRIATE MOVEMENT SPEED; V(m/sec) | (V/V₀)² |
|---|---|---|---|
| 12 G | 3.40 | 3.07 | 0.815 |
| 15 G | 3.83 | 3.42 | 0.797 |
| 18 G | 4.20 | 3.76 | 0.801 |

In the respective cases, the values $(V/V_0)^2$ become about 0.8. Therefore, the appropriate speed (V) for the disc-shaped substrate is obtained from the following equation:

$$v = \sqrt{\frac{0.8 \times Da}{2}} \quad (3)$$
$$= \sqrt{0.4 \times Da}$$

wherein D represents the diameter of the disc-shaped substrate.

In order to form a liquid film having a uniform thickness on any disc-shaped substrate, it is necessary to make the supply amount of a liquid constant since the speed of the dropping unit is constant. However, in areas where no liquid film needs to be formed, for example, an edge of the substrate, the dropping amount of the liquid may be reduced or the dropping of the liquid may be stopped.

In the present embodiment, the liquid is dropped from the single nozzle. However, in the case that a liquid is dropped from plural nozzles, the total amount of the liquid dropped from all of the nozzles corresponds to the dropping amount.

Figure 7:
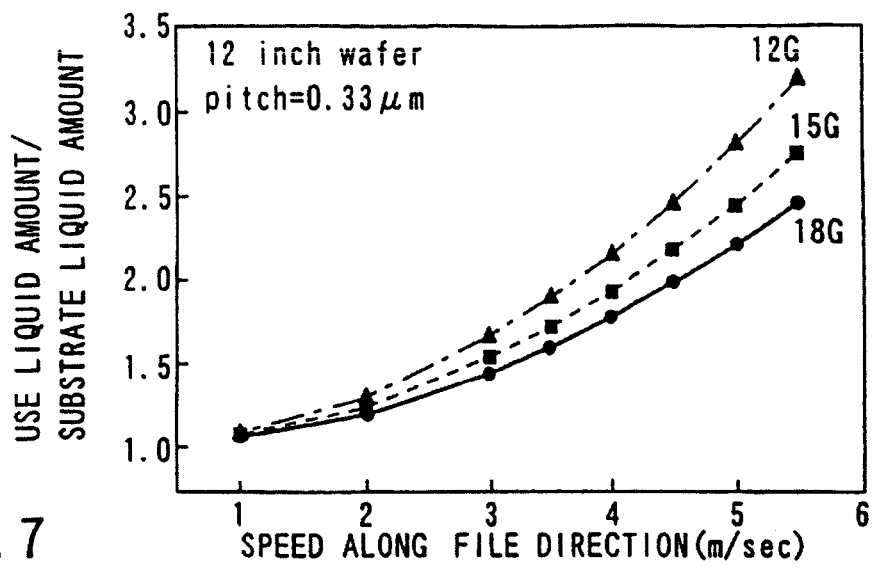
FIG. 7 is a graph of consumption amount of a liquid to movement speed along the file direction of the liquid supply nozzle.

Similar graphs about a 12-inch substrate (disc) are shown in FIGS. 6 and 7. Similarly, the values $(V/V_0)_2$ become about 0.8 in the case of the 12-inch disc. In this way, the values $(V/V_0)_2$ become 0.8 regardless of the sizes of the substrates. Thus, the equation (3) can be applied to all disc-shaped substrates.

Figure 8:
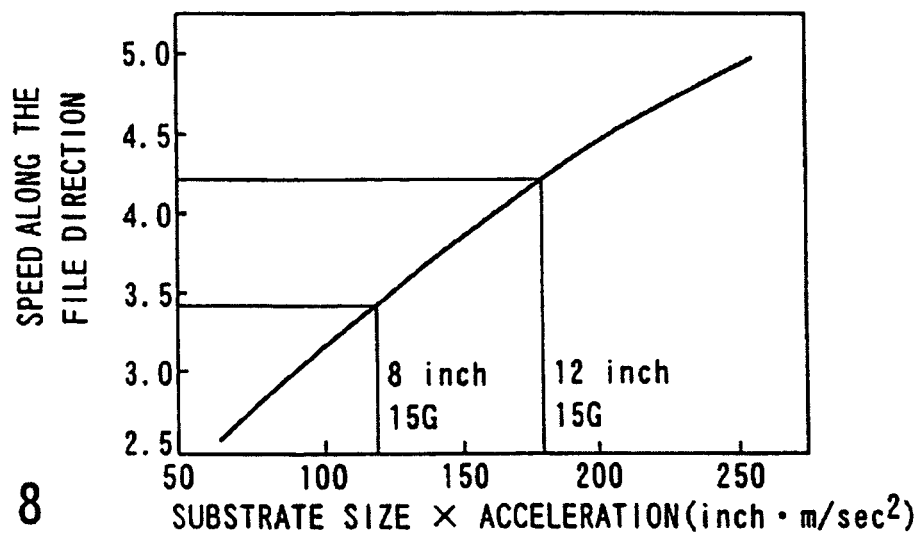
FIG. 8 is a graph showing appropriate movement speed to (substrate size×acceleration)

FIG. 8 shows a relationship between the product of substrate size and acceleration, that is, D×a, and appropriate movement speed. Using this graph, the appropriate movement speed can easily be obtained in the case of disc-shaped substrates.

In the present embodiment, the pitch (see FIG. 2) from the center line of a liquid film dropped from a liquid dropping nozzle to the center line of an adjacent film of a dropped liquid is set to 0.33 mm. However, the application of the equation (3) is not limited to this example. The equation (3) may be used in other examples if in the examples their relative movement pitch is 1 mm or less (x mm or less in the case of nozzles the number of which is x).

Application of an interlayer dielectric (solid content: 4%) was performed at a speed of 3.8 m/sec and an acceleration of 15 G according to the prior art. The use amount of a liquid at this time was 0.85 cc. However, in a sequence using a movement decided by the deciding method of the present embodiment, the use amount of a liquid was 0.75 cc. Thus, about 12% of the liquid could be reduced. By this, the amount of the liquid for one process could also be reduced by 12%.

[Second Embodiment]

The present embodiment relates to a manner for applying a liquid while changing the movement speed of a nozzle and the dropping amount of the liquid dependently on the application length of the liquid, using a disc-shaped 12-inch substrate. The application was started from the center of the substrate, and was performed at a pitch (p) of 0.33 mm toward the right direction of the paper (i.e., along the rank direction). The application reached an end, and subsequently application was performed from a portion shifting by a pitch (p) toward the left side of the paper from the line applied at the center of the substrate to the left end.

The movement speed (v) along the file direction at a portion apart from the center of the substrate by np (wherein n is an integer) was decided as the following in relative to the acceleration (a):

$$v = \sqrt{2a\sqrt{(D/2)^2 - np^2}/2} \quad (4)$$

The dropping speed (W$_0$)[ml/sec] along the file direction was decided as the following in relative to the dropping speed (W$_0$) [ml/sec] along the diameter portion.

$$W = W_0 \times \sqrt{2a\sqrt{(D/2)^2 - np^2}/2} / \sqrt{Da/2} \quad (5)$$

Figure 9:
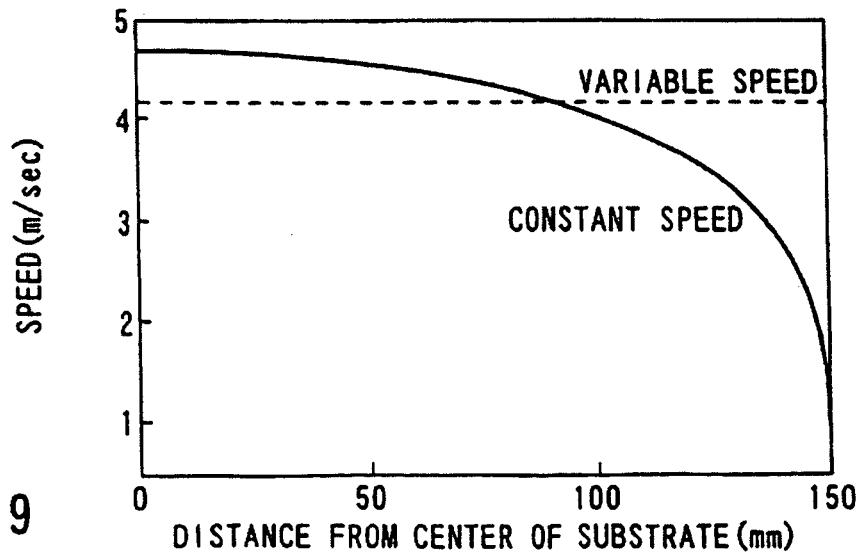
FIG. 9 is a graph showing movement speed to substrate position on the basis of making the speed of each rank optimal.
Figure 10:
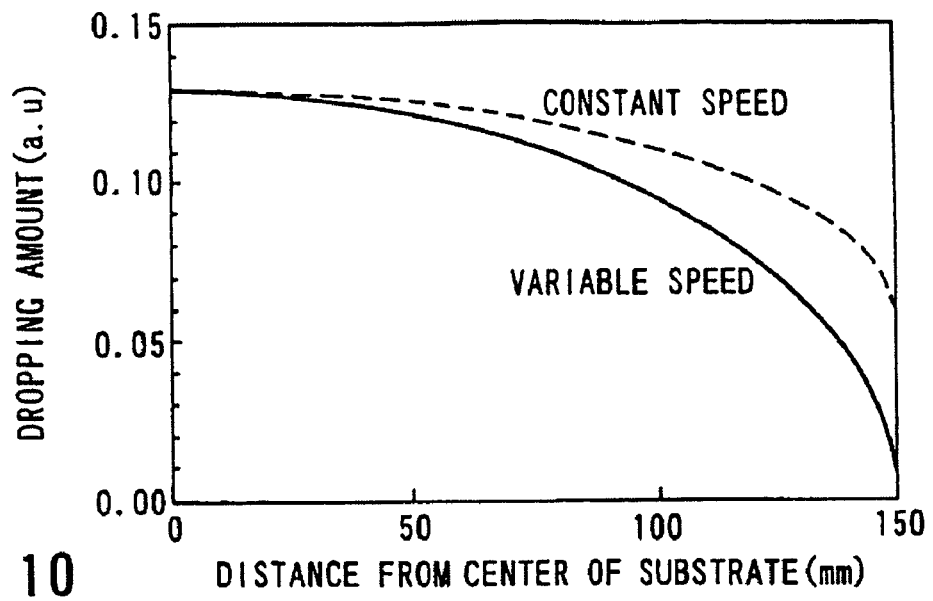
FIG. 10 is a graph showing dropping amount to substrate position on the basis of making the speed of each rank optimal.

Results obtained by making the movement speed and the dropping amount for each of movements along the file direction optimal as described above are shown in FIGS. 9 and 10. Values represented by dot lines are values in the case that movement speed is made optimal (is fixed) by the setting manner described as the first embodiment. A pitch was set to 0.33 mm. The use amount of a liquid for an interlayer dielectric SOG (solid content: 1.5%) used in the process of the dot line was 1.7 cc, but the use amount thereof in an actual process was 1.5 cc. The processing time, which was 104 seconds according to the prior art, could be slightly reduced to 102 seconds. Comparison of the use amounts of the liquid is shown in Table 2. Table 2 shows a case in which a disc-shaped 12-inch substrate was used and acceleration (deceleration) was 15 G.

TABLE 2

|  | PRIOR ART (SET TO DIAMETER) | SET TO 0.8 × DIAMETER | SET BY LINE |
|---|---|---|---|
| USE AMOUNT(cc) | 1.92 | 1.70 | 1.49 |
| RATIO TO PRIOR ART | 1 | 0.89 | 0.78 |

As described as the present embodiment, 20% or more of a liquid can be reduced by using the manner described as the second embodiment (claim 1), as compared with manners in the prior art.

The present embodiment is an example in which the present invention is applied to an interlayer dielectric. The present invention is not however limited to this example. The present invention can be applied to various materials such as a resist material, an antireflection material, a dielectric material and a wiring material.

[Third Embodiment]

By the above-mentioned conditions, processing time can be shortened and the use amount of a liquid used in the formation of a liquid film can be reduced. However, in the case that the above-mentioned embodiments are applied to a semiconductor device, it is essential for the formation of a liquid film that the surface of the liquid film is made flat. Therefore, the following will describe a liquid film forming method in which the surface of a liquid film is made flat.

Figure 11:
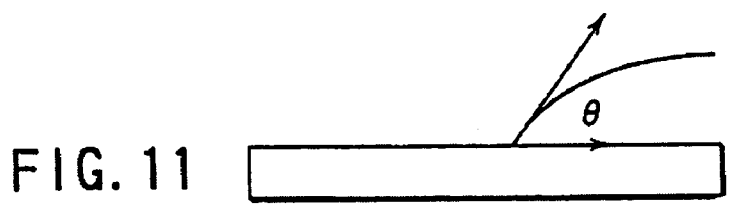
FIG. 11 is a view showing the measuring state that the contact angle of an application liquid to a substrate to be processed in a third embodiment.

As shown in FIG. 11, the contact angle θ an application liquid 13 to a substrate 11 to be processed is obtained. The contact angle θ is measured as follows. A small amount of a liquid is usually pushed out from the tip of a needle of a microsyringe. In the state that the liquid is kept on the tip of the needle by its surface tension, a substrate is brought near a liquid droplet on the tip of the needle from a lower space. If the liquid droplet contacts the substrate, the substrate is immediately detached from the needle, that is, the substrate is moved downwards.

Figure 12:
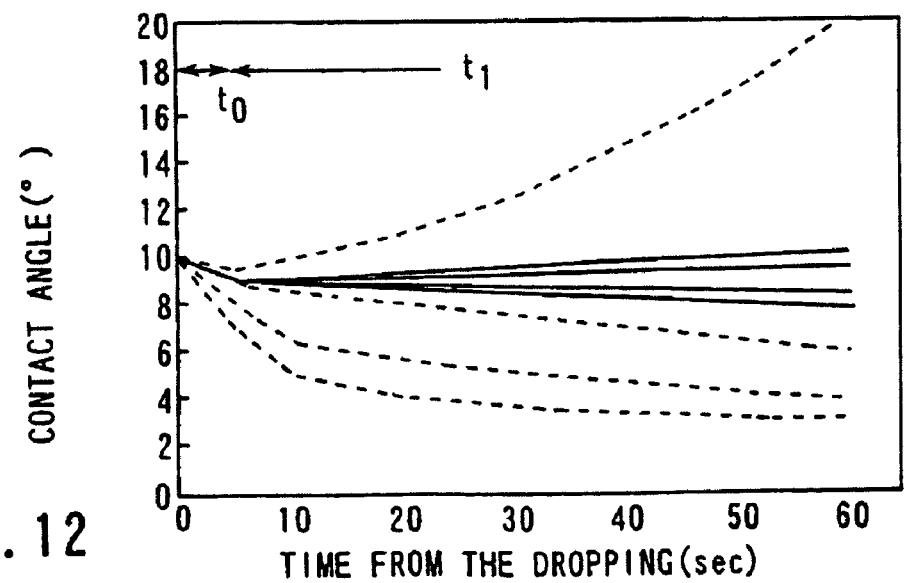
FIG. 12 is a graph showing the change of contact angle of application liquids to a substrate to time after dropping.
Figure 13:
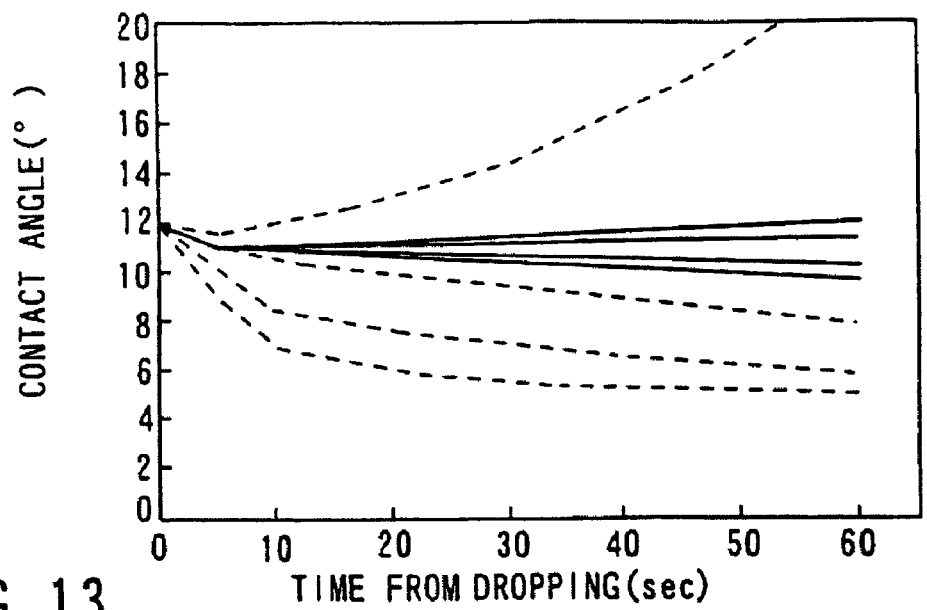
FIG. 13 is a graph showing the change of contact angle of application liquids to a substrate to time after dropping.

First, the liquid detached from the tip of the needle deforms by gravitation applied to the liquid droplet. This deformation is caused for 5 seconds after the liquid droplet contacts the substrate and then the substrate is detached from the needle. Thereafter, the contact angle changes as shown in FIGS. 12 and 13. The changes can be roughly classified into the following three types: decrease with the passage of time; very slightly change; and increase with the passage of time. These changes would be caused by a change in interfacial tension between the liquid and the substrate.

In the liquid whose contact angle decreases with the passage of time, a solid content or a surfactant in the liquid acts on the surface of the substrate. Thus, the liquid has a nature that its interfacial tension becomes weak. In the case that a liquid having such a nature and a substrate is combined, the liquid can easily move on the substrate. For this reason, the liquid is greatly affected by difference in environment, for example, environment temperature, forcible airflow, or airflow caused by difference in environment temperature, so that the liquid moves. Therefore, the uniformity of thickness of a solid layer which is finally obtained deteriorates.

Many resists come under such a case. When a liquid which contains ethyl lactate as a main solvent and also contains a large amount of a solid content is diluted, a surfactant contained in this resist solution is also diluted so that the contact angle thereof becomes smaller with the passage of time. In some cases, it is desired that the amount of the surfactant is larger than the amount used in spin coating method.

On the other hand, in the liquid whose contact angle increases with the passage of time, a solid content or a surfactant in the liquid acts on the surface of a substrate. Thus, the liquid has a nature that its interfacial tension becomes strong, or the solid content, the surfactant or the two condense by strong interfacial tension. In the case that a liquid having such a nature and a substrate is combined, the liquid condenses on the substrate. As a result, a problem that the liquid cannot be applied to necessary areas arises.

Figure 14:
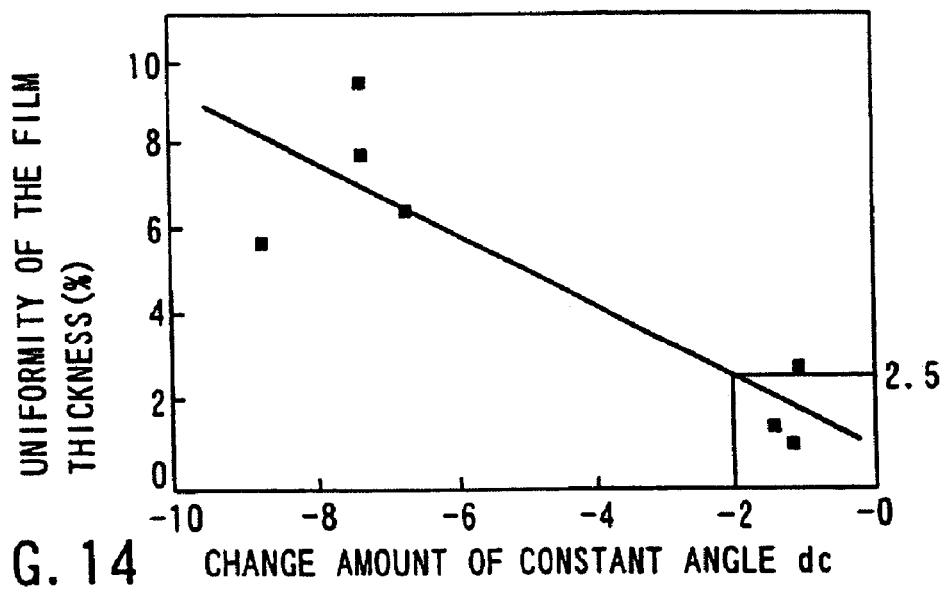
FIG. 14 is a graph showing the relationship between change amount of contact angle to time after dropping and thickness uniformity of a solid layer.

FIG. 14 shows a relationship between change amount of the contact angle to time after dropping and uniformity (range) of thickness of a solid layer.

The change amount (dc) of the contact angle to time is represented by the following:

$$dc = \frac{\theta_1 - \theta_0}{\log_{10}(t_1) - \log_{10}(t_0)} \quad (6)$$

wherein the contact angle of a liquid on a substrate at time $t_0$ represents $\theta_0$(degree), the contact angle at time $t_1$ represents $\theta_1$, $t_0$ is from 5 to 10 seconds, and $t_1$ is from 10 to about 60 seconds.

The liquid was applied under the liquid-applying conditions described as the first and second embodiments. Concerning the thickness of the formed liquid film, in-plane distribution of the thickness was measured with an optical thickness tester. In the formation of interlayer dielectrics or ferroelectric substance films, it is necessary to make the uniformity of the thickness within 5% (±2.5%). It can be understood from FIG. 14 that the change amount (dc) at this time should be |dc|<2.5. Therefore, it was verified that if the change in the contact angle of the liquid from 5 to 60 seconds after dropping is within 2.5 degrees, the in-plane uniformity of the liquid film is within 5%. However, in order to make the liquid film flatter, the change in the contact angle from 5 to 60 seconds after dropping is preferably within 2 degrees.

In order to suppress the change in the contact angle of a liquid to a substrate after dropping, it is advisable that the kind and amount of a solvent, a solid content and a surfactant in a solution is appropriately adjusted.

In the present embodiment, ethyl lactic was used as the solvent, and 1–5% by weight of a KrF resist was used as the solid content. The cohesiveness which became stronger as the percentage of this resist was raised was overcome by increasing the added amount of the surfactant dependently on the amount (% by weight) of the resist.

It is preferred that the contact angle of a liquid to a substrate is less than 20° for 5 seconds after dropping the liquid. If the contact angle is 20° or more, cohesion is caused when the liquid film is dried. Thus., a complete film cannot be formed.

The present embodiment can be applied to all application materials, for example, a resist material, an antireflection material, a dielectric material, and a wiring material. The application method of the present invention can be applied to not only manners of supplying an application liquid as parallel lines and then spreading the liquid to form a liquid film, as seen in the first and second embodiments, but also manners of supplying an application liquid in the form of a spiral from the substantial center of a round substrate to the periphery thereof or from the periphery to the center, and then spreading the liquid to form a liquid film. It was also verified that in application methods using a capillary phenomenon, which have been hitherto carried out, better uniformity of film thickness can be obtained.

In the present embodiment, it is preferred that the average film thickness of a liquid film obtained by spreading a liquid is 20 μm or less. If the film thickness is larger than 20 μm, fluidity is generated in the liquid film so that/the uniformity thereof deteriorates.

[Fourth Embodiment]

An extrafine nozzle is reciprocated at a speed of lm/sec along a file direction on a substrate. At ends of the reciprocation motion, the substrate is successively moved along a rank direction. Thus, a liquid is dropped in the form of a line drawn with a single stroke of the nozzle. In this way, a resist is dropped on the whole surface (diameter: 200 mm) of the substrate. In the first and second embodiments in which a liquid film of the resist is formed on the whole surface of the substrate in the manner mentioned just above, the distance between a step end portion of the substrate and the end of the liquid film was changed dependently on flowing distance from the formation of the liquid film from the dropped resist to a drying step. Specifically, the distance between the step end portion of the substrate and the end of the liquid film is set up to a distance that the end of the flowing liquid film just reached the step end portion of the substrate.

Figure 15:
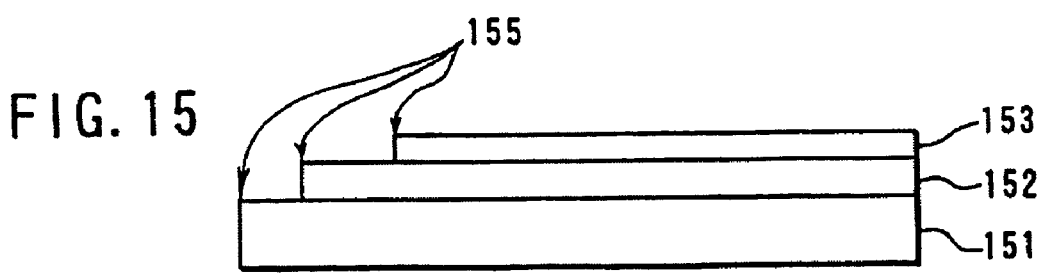
FIG. 15 is a view for explaining boundary step of the edge of a substrate to be processed in a fourth embodiment.

The step end portion of the substrate will be described, referring to FIG. 15. As shown in FIG. 15, in the case that an undercoat film 152 and an antireflection film 153 are made on a Si wafer 151, step end portions are an end of the Si wafer 151, a level-differentiating difference portion between the Si wafer 151 and the undercoat film 152, and ends of the undercoat film 152 and the antireflection film 153. In the case that a liquid film is formed on an undercoat having unevenness, a level-differentiating portion between the outmost portion of the undercoat film and a film outside it or a substrate is defined as a step end portion 155.

In the case that a liquid film 30 μm in thickness made from a liquid resist is formed on a substrate, the liquid flows by 3 mm at a dropping start side during stand-by time until drying processing and the liquid flows by 1 mm at a dropping finish side during the stand-by time until the drying processing. Therefore, in the present embodiment, a dropping start position was set to a position inward by 3 mm from the end of the substrate and a dropping finish position is set to a position inward by 1 mm from the end of the substrate. Considering the timing that the flowing end of the liquid film reaches the end of the substrate, the distance between other ends of the substrate and the end of the liquid film is gradually made smaller within the range of 3 to 1 mm over positions from the dropping start position to the dropping finish position (FIG. 16).

Figure 16:
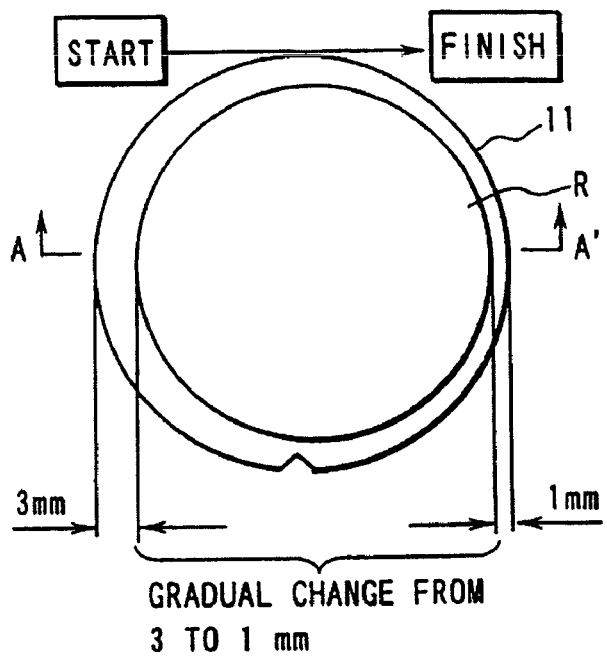
FIG. 16 is a view for explaining a liquid film forming method according to the fourth embodiment.

FIG. 16 is a view for explaining a liquid film forming method according to the fourth embodiment of the present invention. As/shown in FIG. 16, a resist dropping area R is sectioned in a substrate 11. In the area R, the distance between the end of the substrate and the end of the liquid film gradually becomes smaller within the range of 3 to 1 mm over positions from a dropping start position to a dropping finish position.

Figure 17:
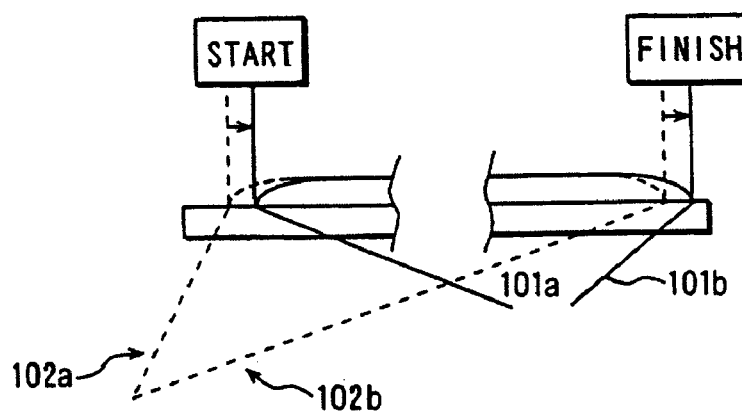
FIG. 17 is a sectional view along the rank direction showing a resist formed by dropping a liquid onto a resist-dropping area R of a substrate to be processed.

FIG. 17 is a sectional view of the state of that a resist is applied onto the resist dropping area R in the substrate of the present embodiment. In FIG. 17, a resist formed by a conventional method is simultaneously shown for reference. FIG. 17 shows a dropping start position 101a and a dropping finish position 101b according to an embodiment. FIG. 17 shows a dropping start position 102a and a dropping finish position 102b according to a conventional method. The sectional view shown in FIG. 17 corresponds to a section taken along A–A' line of FIG. 16.

After the liquid film was formed on the whole surface of the substrate by the present method, a solvent in the liquid film was removed by drying under reduced pressure to form an application film 30 nm in thickness. At last, the film was subjected to heating treatment at 140° C. with a baker, so as to stabilize the application film.

Figure 18:
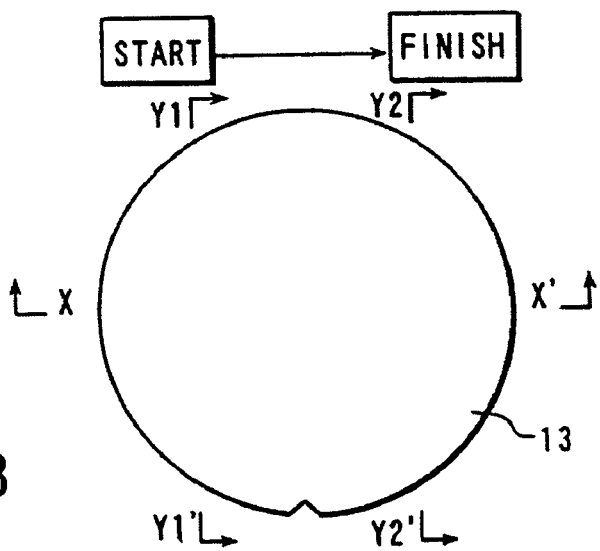
FIG. 18 is a plan view showing measurement positions for obtaining the profile of the thickness shown in FIGS. 19A and 19B.
Figure 19A:
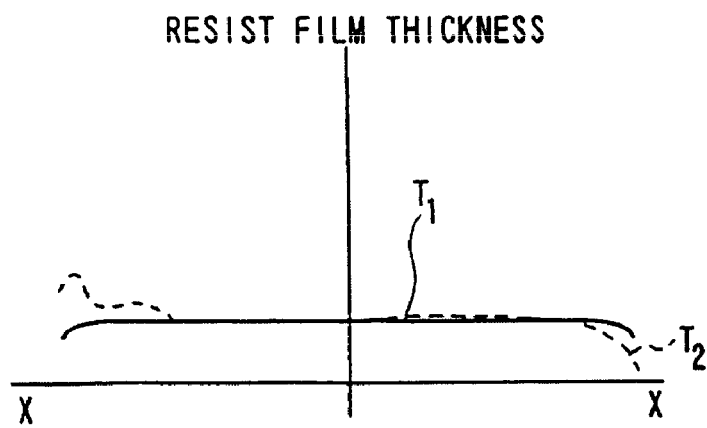
FIGS. 19A and 19B are views each of which shows the profile of the resist thickness.
Figure 19B:
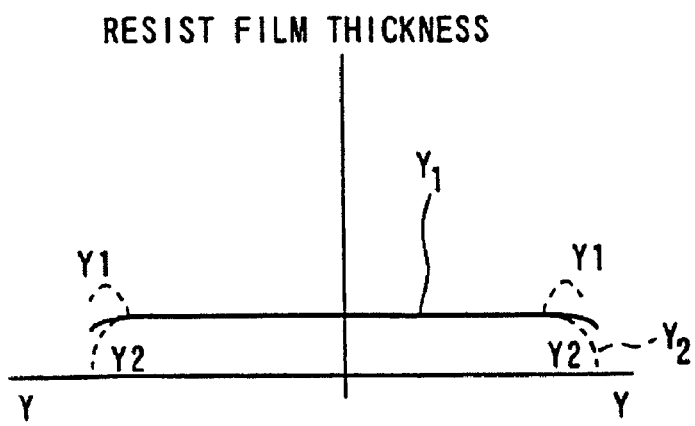

The distribution of thickness of the formed resist film was measured in an optical manner. FIGS. 19A and 19B are views each of which shows a distribution of the film thickness. FIG. 18 shows positions where the distribution of the film thickness was measured. FIG. 19A shows the distribution of the film thickness $T_1$ according to the present invention along the X–X' line of FIG. 18, and FIG. 19B shows the distributions of the film thickness along the Y1–Y1' and Y2–Y2' lines. In FIG. 19B, $Y_1$ represents the distribution of thickness of the application film according to the present invention. FIGS. 19A and 19B also show a distribution of thickness of an application film formed by a conventional method $T_2$ and $Y_2$ in which the distance between the end of a liquid film and the end of a substrate was constantly set to 2 mm over positions from an application start side to an application finish side.

As shown in FIGS. 19A and 19B, in the distribution of the thickness of the application film formed by the conventional method, the film thickness increases highly at the application start side and the film thickness decreases gently at the application finish side. The reason why such a distribution of the film thickness is produced is that the flowing distance of the liquid during the time from the formation of the liquid film to a drying processing is different between the application start side and the application finish side.

Figure 20A:
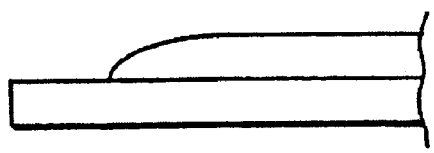
FIG. 20A is a view showing a state that an edge of a processed substrate and an edge of a liquid film at an application start side at the time of dropping a liquid in the case of a conventional film forming method.
Figure 20B:
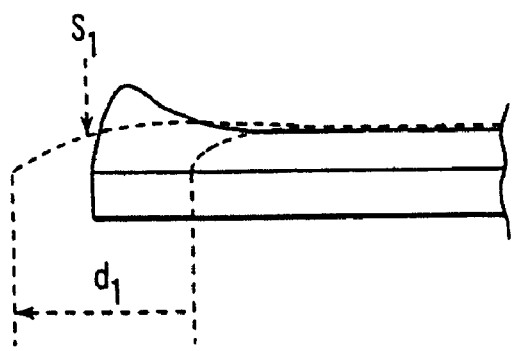
FIG. 20B is a view showing a state that the end of the processed substrate and the end of the liquid film at the application start side at the time of finishing the formation of the liquid film in the case of the conventional film forming method.
Figure 21A:
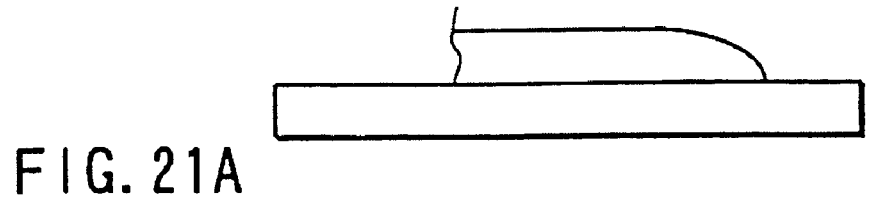
FIG. 21A is a view showing a state that an end of the processed substrate and an end of the liquid film at an application finish side at the time of dropping the liquid in the case of the conventional film forming method.
Figure 21B:
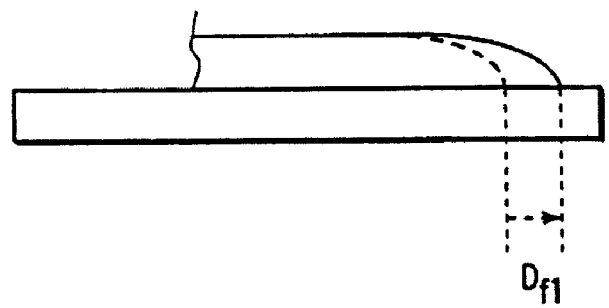
FIG. 21B is a view showing a state that the end of the processed substrate and the end of the liquid film at the application finish side at the time of finishing the formation of the liquid film in the case of the conventional film forming method.

This fact will be described, referring to FIGS. 20 and 21. FIGS. 20A, 20B, 21A and 21B show states of the end of a substrate and the end of a liquid film in the case of a conventional liquid film forming method. FIG. 20A shows a state of the end of the substrate and the end of the liquid film at an application start side at the time of dropping, and FIG. 20B shows a state of the end of the substrate and the end of the liquid film at the application start side at the time of finishing the formation of the liquid film. FIG. 21A shows a state of the end of the substrate and the end of the liquid film at an application finish side at the time of the dropping, and FIG. 21B shows a state of the end of the substrate and the end of the liquid film at the application finish side at the time of finishing the formation of the liquid film.

Stand-by time until the drying process is longer at the application start side than at the application finish side. Thus, the flowing distance of the liquid becomes longer accordingly. In the case that at this time the distance up to the end of the substrate is smaller than the flowing distance $d_1$, the flow of the liquid is stopped at the end of the substrate 11 show at $S_1$ so that the thickness of the liquid film 13 increases with subsequent flow of the liquid, as shown in FIGS. 20A and 20B.

On the other hand, the liquid is subjected to the given drying processing at the application finish side immediately after the formation of the liquid film, so that the flowing distance $Df_1$ becomes smaller at this side than at the application start side. In the case that at this time the distance up to the end of the substrate is larger than the distance of flow, the thickness of the liquid film gently becomes thinner toward the end of the liquid film at a given surface contact angle as shown in FIGS. 21A and 21B.

As described above, in this conventional method, fluidity of the liquid after being dropped is ignored and the above-mentioned distance is set constant from the dropping start side to the dropping finish side. For this reason, an abnormality of the film thickness arises as shown in FIGS. 20B and 21B.

Figure 22:
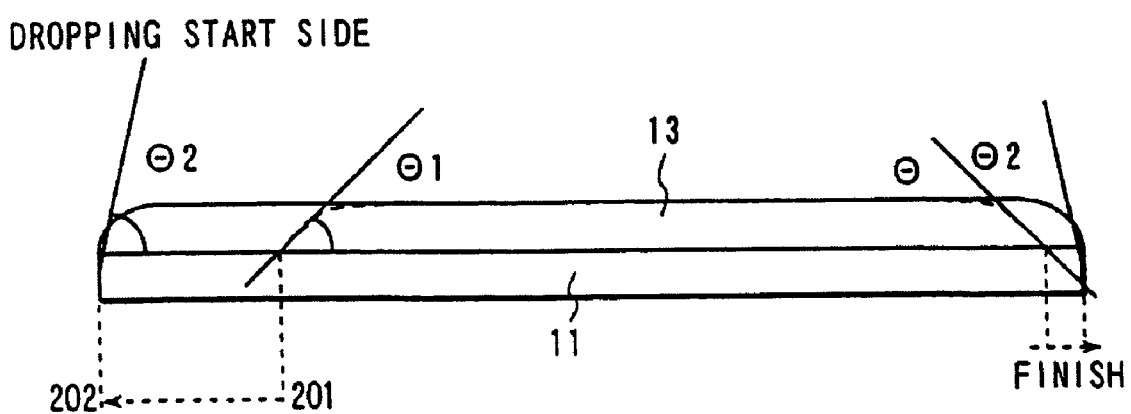
FIG. 22 is a view for explaining a state of the end of the processed substrate and the end of the liquid film in the case of/the liquid film forming method according to the fourth embodiment.

On the other hand, as in the present embodiment, in the case that considering the fluidity of the liquid after being dropped, the distance between the end of the substrate and the end of the liquid film is changed over positions from the dropping start side to the dropping finish side in the manner that the end of the dried liquid film just reaches the end of the substrate, it is possible to realize a symmetric and uniform distribution of the thickness of the applied film over all peripheral portions of the substrate. When the liquid film reaches the end of the substrate 11, contact angle of the end of the liquid film 13, shown at 201, becomes large (for example, θ1→θ2) shown at 202, as shown in FIG. 22. In this case, therefore, the liquid film comes to have a steeper edge than the case that the liquid film does not reach the end of the substrate 11, as shown in FIG. 22.

The present embodiment can be applied to all application materials, for example, a resist material, an antireflection material, a dielectric material, and a wiring material. The application method of the present invention can be applied to not only the scope described as the present embodiment but also an embodiment in which a slit-form dropping nozzle having the same width as a substrate is used, or a scan application method in which a meniscus is produced between a dropping nozzle and a substrate. The shape of a substrate to be processed is not limited to a circle as shown in the above-mentioned embodiment. A rectangle substrate, such as a reticle or a liquid crystal substrate, may be used. In the case of the rectangle substrate as shown in, for example, FIG. 23, a liquid is dropped onto a liquid applying area R set up in a substrate 21.

The distance between the area where a liquid is dropped and the step end portion of a substrate appropriately set up dependently on physical properties of the liquid and conditions of the substrate within the scope of the subject matter of the present embodiment that this distance is changed from a large value to a small value over positions from a dropping start side to a dropping finish side.

In the present embodiment, the area where the liquid is dropped is decided in the manner that the liquid film reaches the step end portion of the substrate by fluidity of the liquid. Further, the distance between the area where the liquid is dropped and the step end portion of the substrate is changed from a large value to a small value over positions from the dropping start side to the dropping finish side. However, the liquid film may not reach the step end portion of the substrate. In the case that the liquid film does not reach the step end portion, it is not essential that the distance between the area where the liquid is dropped and the step end portion of the substrate is changed from a large value to a small value over positions from the dropping start side to the dropping finish side.

[Fifth Embodiment]

An extrafine nozzle is reciprocated at a speed of 1m/sec along a file direction on a substrate. At the same time, the substrate is successively moved along a rank direction. Thus, a, liquid is dropped in the form of a line drawn with a single stroke of the nozzle. In this way, the resist is dropped on the whole surface (diameter: 200 mm) of the substrate. In the first and second embodiments in the manner mentioned just above, a DUV resist is formed. In this case, according to conventional manners, the thickness of the liquid film has been set to 30 μm (line pitch along the rank direction: 0.3 mm). However, in the present embodiment, the liquid film was made to have a thickness of 20 or 15 μm, which was thinner than the thickness based on the conventional manners.

The thickness of the liquid film was controlled by changing a line pitch. In the case of 20 μm and 15 μm, the line pitches were 0.6 and 0.8 mm, respectively. The distance between the end of the substrate and the end of the liquid film was constantly set to 2 mm over positions from a dropping start portion to a dropping finish portion. The liquid films were formed on the whole of the substrates to have the respective target thicknesses. Thereafter, solvents in the liquid films were removed by drying under reduced pressure, to form application films having thicknesses of 300 nm, 200 nm and 150 nm, respectively. At last, the films were subjected to heating treatment at 140° C. with a baker to stabilize the application films.

The distributions of thickness of the respective formed resist films were measured in an optical manner. FIG. 24 shows measured results thereof. FIG. 24 also shows uniformity of the thicknesses of the application films except abnormal areas of the film thickness at the peripheral portion of the substrates.

As shown in FIG. 24, in the distribution of the thickness of the application film formed from the liquid film 30 μm in thickness by the conventional method shown with the broken line, the film thickness increased highly at the application start side and the film thickness decreased gently at the application finish side. The reason why such a distribution of the film thickness is produced is that the liquid film flows during the time from the formation of the liquid film to the drying processing.

Figure 25A:
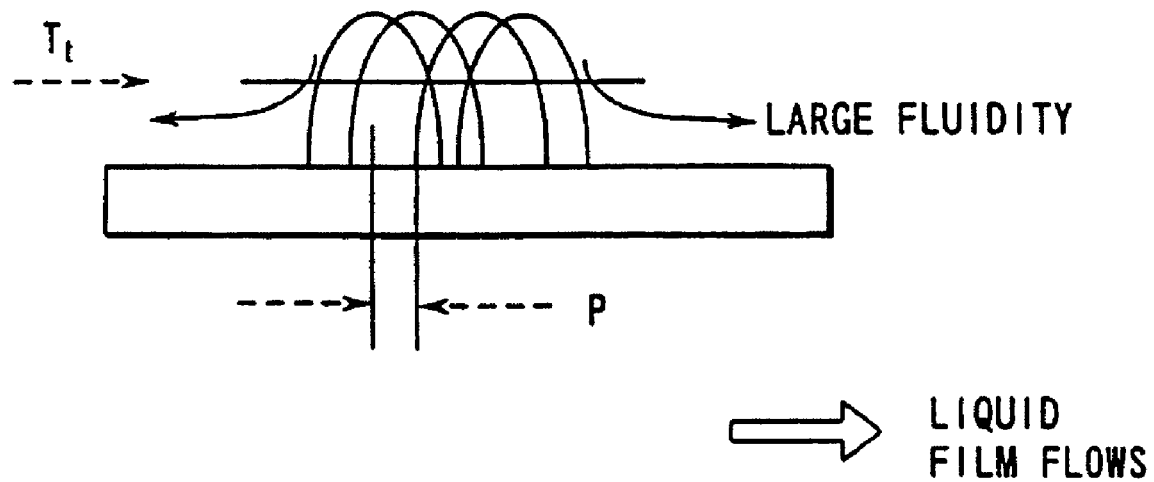
FIG. 25A is a view for explaining the relationship between the thickness of the liquid film and the fluidity according to a conventional film forming method.
Figure 25B:
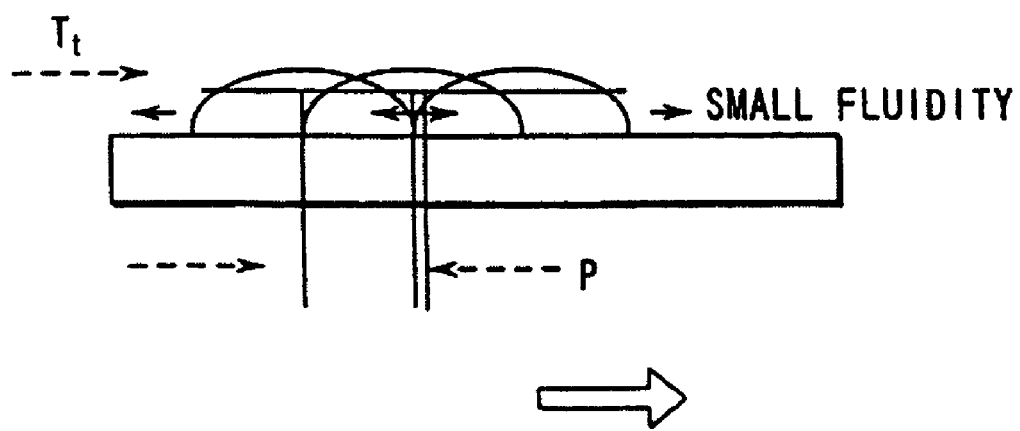
FIG. 25B is a view for explaining the relationship between thickness of the liquid film and fluidity according to a film forming method of the present invention.

The following will describe the relationship between thickness of the liquid film and fluidity thereof according to a conventional film forming method and the film forming method of the present embodiment with reference to FIGS. 25A and 25B. As show in the FIGS. 25A and 25B $T_t$ represents a target thickness of the liquid film. FIG. 25A is a view for explaining this relationship according to the conventional film forming method. FIG. 25B is a view for explaining this relationship according to the film forming method of the present embodiment.

In the case that the thickness of the liquid film was 30 μm by the conventional method, the thickness was larger than the thickness that the substrate could keep as shown in FIG. 25A when the liquid was dropped to form the liquid film. Therefore, flow was remarkably caused. In the state that such flow is easily caused, the liquid film is easily affected by environment at the time of the application. As shown in FIG. 25A, when the pitch p is made small to make the thickness of the liquid film large, the liquid film flows. Thus, control of the film thickness at the center of the substrate becomes difficult, and uniformity deteriorates.

On the other hand, when the liquid film is made thinner to have a thickness of 20 μm or 15 μm as in the present invention shown with solid lines in FIG. 24, the liquid film is easily kept on the substrate by surface tension of the liquid as shown in FIG. 25B. As shown in FIGS. 25B, when the pitch p is made large to make the thickness of the liquid film small, the liquid film balances with interfacial tension with the substrate so that the film does not move. Thus, when the liquid film is formed, flow is easily caused. Accordingly, abnormality of the film thickness at the peripheral portion of the substrate (in particular application start and finish portions), which is caused by flow, is overcome. Furthermore, the flow of the liquid is not easily caused even if the liquid is affected by external environmental factors in the application and drying steps. As a result, uniformity becomes good.

The present embodiment can be applied to all application materials, for example, a resist material, an antireflection material, a dielectric material, and a wiring material. The application method of the present invention can be applied to not only the scope described as the present embodiment but also an embodiment in which a slit-form dropping nozzle having the same width as a substrate is used, or a scan application method in which a meniscus is produced between a dropping nozzle and a substrate. The shape of a substrate to be processed is not limited to a circle as shown in the above-mentioned embodiment. A rectangle substrate, such as a reticle or a liquid crystal substrate, may be used. The thickness of the liquid film at the time of dropping is not limited to that in the present embodiment. The scan speed of the nozzle, the amount of the jetted-out liquid, physical properties of the used liquid, and conditions of the substrate may be changed. They may be appropriately set up so far as they do not depart from the scope of the subject matter of the present embodiment The present invention is not limited to the above-mentioned embodiments, and may be varied within the scope of the subject matter of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A liquid film forming method of dropping a liquid to be spread on a substrate to be processed from a dropping nozzle or dropping nozzles of a dropping unit onto the substrate, and then moving the dropping unit and the substrate relatively while keeping the liquid dropping on the substrate, so as to form a liquid film on the substrate, wherein the relative movement of the dropping unit and the substrate is composed of straight movement along a file direction in which the dropping unit passes from one end side of the substrate through an upper space over the substrate to the other end side of the substrate, and movement along a rank direction, and a distance between a dropping start position and the adjacent edge of the substrate is relatively larger than a distance between a dropping end position and the adjacent edge of the substrate along the rank direction, and the distance between a liquid film and the adjacent edge of the substrate along the file direction is set so as to gradually become smaller from the dropping start position to the dropping end position.

2. The liquid film forming method according to claim 1, wherein the distance between the end of the liquid film and the adjacent edge of the substrate is decided dependently on such a distance that the liquid flows on the substrate after the dropping of the liquid on the substrate.

3. The liquid film forming method according to claim 1, wherein the distance between the end of the liquid film and the adjacent edge of the substrate is defined as a distance that the end of the liquid film reaches the end of the substrate by flow.

* * * * *

UNITED STATES PATENT AND TRADEMARK OFFICE
CERTIFICATE OF CORRECTION

| | |
|---|---|
| PATENT NO. | : 7,125,584 B2 |
| APPLICATION NO. | : 10/697436 |
| DATED | : October 24, 2006 |
| INVENTOR(S) | : Ito |

It is certified that error appears in the above-identified patent and that said Letters Patent is hereby corrected as shown below:

Claims 1-3, column 16, lines 16-46, delete claims 1-3 and substitute the following claims 1-3 therefor:

1. A liquid film forming method of dropping a liquid to be spread on a substrate to be processed from a dropping nozzle or dropping nozzles of a dropping unit onto the substrate, and then moving the dropping unit and the substrate relatively while keeping the liquid dropping on the substrate, so as to form a liquid film on the substrate, wherein the relative movement of the dropping unit and the substrate is composed of straight movement along a file direction in which the dropping unit passes from one end side of the substrate through an upper space over the substrate to the other end side of the substrate, and movement along a rank direction, and a distance between a dropping start position on the substrate and an edge of the substrate closest to the dropping start position is relatively larger than a distance between a dropping end position on the substrate and an edge of the substrate closest to the dropping end position, and a distance between an end of the liquid film and an edge of the substrate closest to the end of the liquid film gradually decreases from the dropping start position to the dropping end position.

UNITED STATES PATENT AND TRADEMARK OFFICE
CERTIFICATE OF CORRECTION

PATENT NO.       : 7,125,584 B2
APPLICATION NO.  : 10/697436
DATED            : October 24, 2006
INVENTOR(S)      : Ito It is certified that error appears in the above-identified patent and that said Letters Patent is hereby corrected as shown below:

2.    The liquid film forming method according to claim 1, wherein the distance between the end of the liquid film and the edge of the substrate closest to the end of the liquid film is decided based on a distance that the liquid flows on the substrate after the dropping of the liquid on the substrate.

3.    The liquid film forming method according to claim 1, wherein the distance between the end of the liquid film and the edge of the substrate closest to the end of the liquid film is a distance that the liquid flows on the substrate after the dropping of the liquid from the end of the liquid film to the end of the substrate closest to the end of the liquid film.

Signed and Sealed this

Sixteenth Day of January, 2007

JON W. DUDAS
*Director of the United States Patent and Trademark Office*